United States Patent

Lee et al.

(10) Patent No.: US 8,873,280 B2
(45) Date of Patent: Oct. 28, 2014

(54) SPIN TRANSFER TORQUE RANDOM ACCESS MEMORY

(75) Inventors: Tzung Han Lee, Taipei (TW); Chung-Lin Huang, Taoyuan County (TW); Ron Fu Chu, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 355 days.

(21) Appl. No.: 13/282,771

(22) Filed: Oct. 27, 2011

(65) Prior Publication Data

US 2013/0062674 A1    Mar. 14, 2013

(30) Foreign Application Priority Data

Sep. 8, 2011 (TW) .............................. 100132403 A

(51) Int. Cl.
*G11C 11/00* (2006.01)

(52) U.S. Cl.
USPC ........... 365/158; 365/171; 365/173; 365/148; 365/174

(58) Field of Classification Search
CPC ......... G11C 11/14; G11C 11/15; G11C 11/16

USPC .......................... 365/158, 171, 173, 148, 174
See application file for complete search history.

(56) References Cited

U.S. PATENT DOCUMENTS

| | | | |
|---|---|---|---|
| 6,927,468 B2 * | 8/2005 | Yoda et al. ..................... | 257/422 |
| 7,919,794 B2 * | 4/2011 | Gu et al. ....................... | 257/241 |
| 2004/0052131 A1 * | 3/2004 | Komuro et al. ............... | 365/202 |
| 2008/0055789 A1 * | 3/2008 | Kim et al. ..................... | 360/324 |

\* cited by examiner

*Primary Examiner* — Han Yang
(74) *Attorney, Agent, or Firm* — Rosenberg, Klein & Lee

(57) ABSTRACT

A spin transfer torque random access memory includes a substance unit, a source line unit, an insulation unit, a transistor unit, a MTJ unit, and a bit line unit. The substance unit includes a substance layer. The source line unit includes a plurality of source lines formed inside the substance layer. The transistor unit includes a plurality of transistors respectively disposed on the source lines. Each transistor includes a source region formed on each corresponding source line, a drain region formed above the source region, a channel region formed between the source region and the drain region, and a surrounding gate region surrounding the source region, the drain region, and the channel region. The MTJ unit includes a plurality of MTJ structures respectively disposed on the transistors. The bit line unit includes at least one bit line disposed on the MTJ unit.

1 Claim, 4 Drawing Sheets

SPIN TRANSFER TORQUE RANDOM ACCESS MEMORY

BACKGROUND OF THE INVENTION

1. Field of the Invention

The instant disclosure relates to a random access memory, and more particularly, to a spin transfer torque random access memory (STT-RAM).

2. Description of Related Art

In conventional spin transfer torque random access memory (STT-RAM) the same current path is often used to write data and to read data. To write data in a conventional STT-RAM, a write current may flow through a magnetic tunnel junction (MTJ) element and an associated access transistor. The write current can change the orientation of magnetic poles in the MTJ element. When the write current flows in a first direction, the MTJ element can be placed into or remain in a first state, where its magnetic poles are in a parallel orientation. When the write current flows in a second direction, opposite to the first direction, the MTJ element can be placed into or remain in a second state, where its magnetic poles are in an anti-parallel orientation. To read data in a conventional STT-RAM, a read current may flow through the MTJ element and its associated access transistor via the same current path used to write data in the MTJ element. If the magnetic poles of the MTJ element are in a parallel orientation, the MTJ element presents a resistance that is different than the resistance the MTJ element would present if the magnetic poles of the MTJ element were in an anti-parallel orientation. Thus, in a conventional STT-RAM, there are two distinct states defined by two different resistances, and a logic "0" or a logic "1" value can be read based on the state.

In a conventional STT-RAM as described above, a high read current can allow more consistent detection of MTJ element resistance, which may translate into better read accuracy. Further, a high read current can reduce the time required for sensing resistance, which may translate into a faster read cycle. However, if the read current has a value, exceeding the value of a critical disturb current of the MTJ element, the read current can cause the MTJ element to change states (or "flip"). Keeping the value of the read current below the value of the critical disturb current can be performed by protection and tracking circuits but such circuits can increase the size and reduce performance of STT-RAM devices.

SUMMARY OF THE INVENTION

One aspect of the instant disclosure relates to a spin transfer torque random access memory.

One of the embodiments of the instant disclosure provides a spin transfer torque random access memory, comprising: a substance unit, a source line unit, an insulation unit, a transistor unit, a MTJ unit, and a hit line unit. The substance unit includes at least one substance layer. The source line unit includes a plurality of source lines formed inside the at least one substance layer and separated from each other by a predetermined distance. The insulation unit includes at least one insulation layer formed inside the at least one substance layer to insulate the source lines from each other. The transistor unit includes a plurality of transistors respectively disposed on the source lines, wherein each transistor includes a source region formed on each corresponding source line, a drain region formed above the source region, a channel region formed between the source region and the drain region, and a surrounding gate region surrounding the source region, the drain region, and the channel region. The MTJ unit includes a plurality of MTJ structures respectively disposed on the transistors, wherein each MTJ structure contacts the drain region of each corresponding transistor. The bit line unit includes at least one bit line disposed on the MTJ unit.

Another one of the embodiments of the instant disclosure provides a spin transfer torque random access memory, comprising: a substance unit, a source line unit, an insulation unit, a transistor unit, a MTJ unit, and a bit line unit. The substance unit includes at least one substance layer. The source line unit includes a plurality of source lines formed inside the at least one substance layer and separated from each other by a predetermined distance. The insulation unit includes at least one insulation layer formed inside the at least one substance layer to insulate the source lines from each other. The transistor unit includes a plurality of transistors respectively disposed on the source lines. The MTJ unit includes a plurality of MTJ structures respectively disposed on the transistors, wherein each MTJ structure includes a first magnetic layer formed on each corresponding transistor, a tunneling barrier layer formed on the first magnetic layer, and a second magnetic layer formed on the tunneling barrier layer and contacting the at least one bit line. The bit line unit includes at least one bit line disposed on the MTJ unit, wherein the at least one bit line contacts the second magnetic layer of each MTJ structure.

Yet another one of the embodiments of the instant disclosure provides a spin transfer torque random access memory, comprising: a substance unit, a source line unit, an insulation unit, a transistor unit, a MTJ unit, and a bit line unit. The substance unit includes at least one substance layer. The source line unit includes a plurality of source lines formed inside the at least one substance layer and separated from each other by a predetermined distance. The transistor unit includes a plurality of transistors respectively disposed on the source lines, wherein each transistor includes a source region formed on each corresponding source line, a drain region formed above the source region, a channel region formed between the source region and the drain region, and a surrounding gate region surrounding the source region, the drain region, and the channel region. The MTJ unit includes a plurality of MTJ structures respectively disposed on the transistors, wherein each MTJ structure contacts the drain region of each corresponding transistor, and each MTJ structure includes a first magnetic layer formed on each corresponding transistor, a tunneling barrier layer formed on the first magnetic layer, and a second magnetic layer formed on the tunneling barrier layer and contacting the at least one bit line. The bit line unit includes at least one bit line disposed on the MTJ unit, wherein the at least one bit line contacts the second magnetic layer of each MTJ structure.

Therefore, the instant disclosure can match the substance unit, the source line unit, the insulation unit, the transistor unit, the MTJ unit, and the bit line unit with each other to design the spin transfer torque random access memory.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
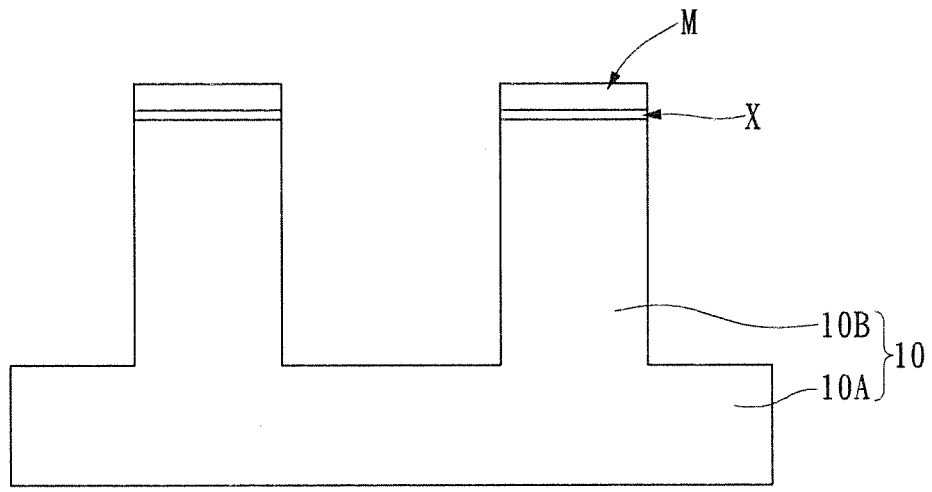
FIG. 1 shows a lateral, schematic view of providing at least one substance layer according to the instant disclosure.

Referring to FIGS. 1 to 6, where the instant disclosure provides a method for manufacturing a spin transfer torque random access memory. For example, the method comprises the following steps of:

First, referring to FIG. 1, providing at least one substance layer 10. For example, the substance layer 10 can be made of silicon material. The substance layer 10 has a base portion 10A and a plurality of protrusion portions 10B (such as cylindrical protrusion portion) projected upwardly from the base portion 10A, and each hard mask M made of SiN is formed on each corresponding protrusion portion 10B through each corresponding dioxide X.

Figure 2:
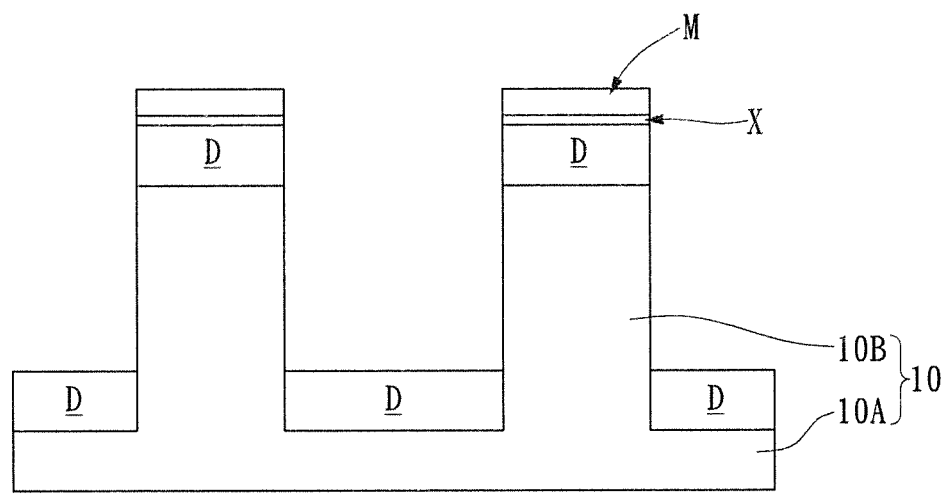
FIG. 2 shows a lateral, schematic view after finishing the ion implantation process according to the instant disclosure.

Next, referring to FIG. 2, forming heavy doping regions D inside the base portion 10A and the protrusion portion 10B of the substance layer 10 by the ion implantation method. For example, the instant disclosure can use boron or arsenic to execute ion implantation.

Figure 3:
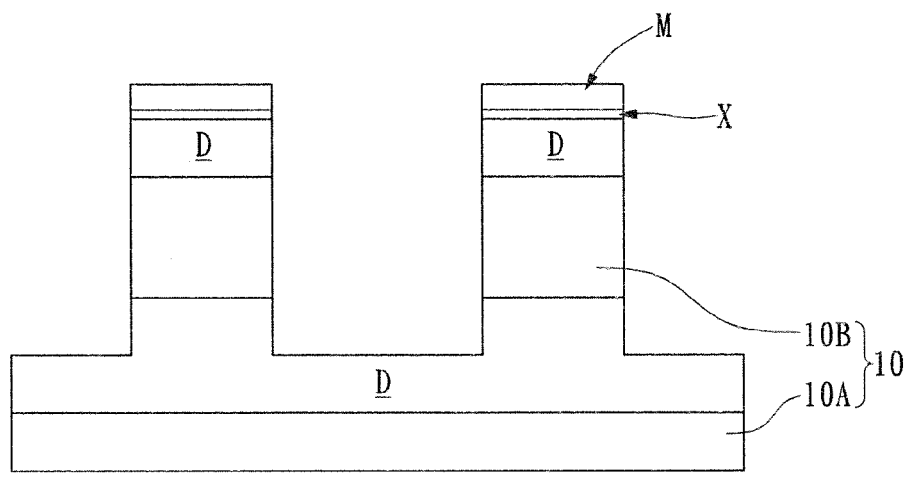
FIG. 3 shows a lateral, schematic view after finishing the ion diffusion process according to the instant disclosure.

Then, referring to FIG. 3, diffusing the heavy doping regions D from the base portion 10A of the substance layer 10 to the protrusion portions 10B of the substance layer 10 by the ionic diffusion method.

Figure 4:
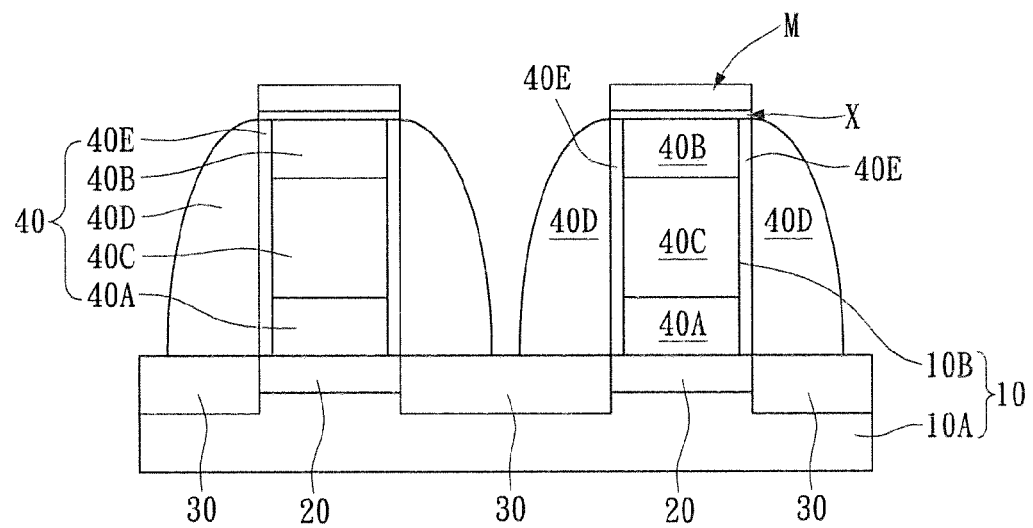
FIG. 4 shows a lateral, schematic view of forming at least one insulation layer inside the substance layer and respectively placing a plurality of transistors on the source lines according to the instant disclosure.

Afterward, referring to FIG. 4, forming at least one insulation layer 30 inside the base portion 10A of the substance layer 10 to form a plurality of source lines 20 formed inside the base portion 10A of the substance layer 10 and separated from each other, and then respectively forming a plurality of transistors 40 on the source lines 20. For example, each transistor 40 includes a source region 40A formed on each corresponding source line 20, a drain region 40B formed above the source region 40A, a channel region 40C formed between the source region 40A and the drain region 40B, and a surrounding gate region 40D simultaneously surrounding the source region 40A, the drain region 40B, and the channel region 40C. In addition, each transistor 40 further includes a surrounding gate oxide layer 40E contacting and surrounding the source region 40A, the drain region 4013, and the channel region 40C, and the surrounding gate region 40D contacts and surrounds the surrounding gate oxide layer 40E.

Figure 5:
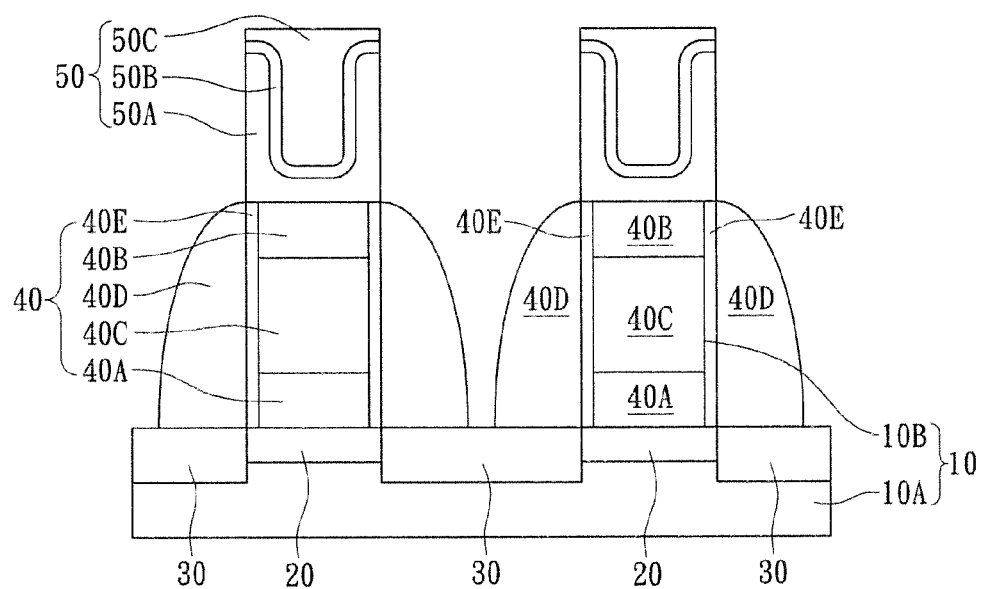
FIG. 5 shows a lateral, schematic view of removing each hard mask and each dioxide and respectively forming a plurality of MTJ structure on the transistors according to the instant disclosure.

Next, referring to FIG. 5, removing each hard mask M and each dioxide X, and then respectively forming a plurality MTJ structure 50 on the transistors 40. For example, each MTJ structure 50 includes a first magnetic layer 50A formed on each corresponding transistor 40, a tunneling barrier layer 50B formed on the first magnetic layer 50A, and a second magnetic layer 50C formed on the tunneling barrier layer 50B.

Figure 6:
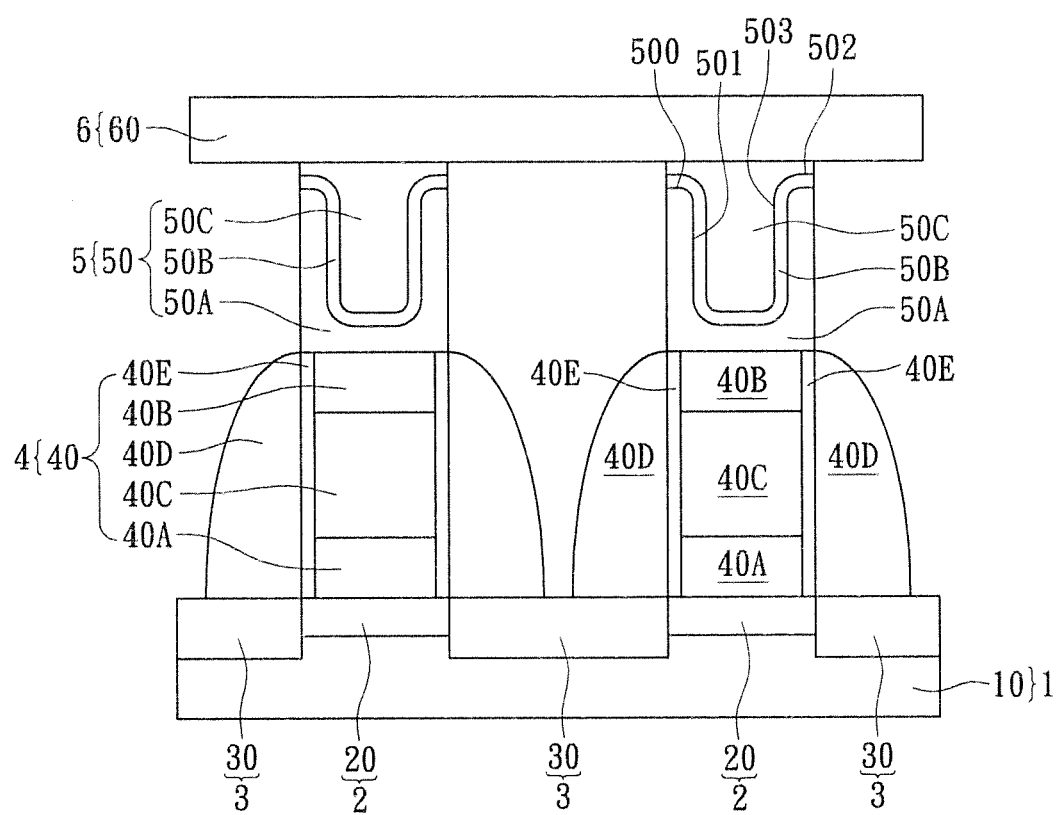
FIG. 6 shows a lateral, schematic view of the spin transfer torque random access memory according to the instant disclosure.

Finally, referring to FIG. 6, placing at least one bit line 60 on the MTJ structures 50, where the bit line 60 can contact the second magnetic layer 50C of each MTJ structure 50.

Referring to FIG. 6 again, the instant disclosure provides a spin transfer torque random access memory, comprising: a substance unit 1, a source line unit 2, an insulation unit 3, a transistor unit 4, a MTJ unit 5, and a bit line unit 6.

In addition, the substance unit 1 includes at least one substance layer 10. The source line unit 2 includes a plurality of source lines 20 formed inside the substance layer 10 and separated from each other by a predetermined distance. The insulation unit 3 includes at least one insulation layer 30 formed inside the substance layer 10 to insulate the source lines 20 from each other. The transistor unit 4 includes a plurality of transistors 40 respectively disposed on the source lines 20. Each transistor 40 includes a source region 40A formed on each corresponding source line 20, a drain region 40B formed above the source region 40A, a channel region 40C formed between the source region 40A and the drain region 40B, and a surrounding gate region 40D simultaneously surrounding the source region 40A, the drain region 4013, and the channel region 40C. The MTJ unit 5 includes a plurality of MTJ structures 50 respectively disposed on the transistors 40, and each MTJ structure 50 contacts the drain region 40B of each corresponding transistor 40. The bit line unit 6 includes at least one bit line 60 disposed on the MTJ unit 5.

For example, each transistor 40 further includes a surrounding gate oxide layer 40E contacting and surrounding the source region 40A, the drain region 40B, and the channel region 40C, and the surrounding gate region 40D contacts and surrounds the surrounding gate oxide layer 40E. In addition, each MTJ structure 50 includes a first magnetic layer 50A formed on each corresponding transistor 40, a tunneling barrier layer 50B formed on the first magnetic layer 50A, and a second magnetic layer 50C formed on the tunneling barrier layer 50B and contacting the bit line 60. Moreover, the first magnetic layer 50A has a first top surface 500 and a first groove 501 concaved downwardly from the first top surface 500, and the tunneling barrier layer 50B is formed on the first top surface 500 and the inner surface of the first groove 501. The tunneling barrier layer 50B has a second top surface 502 and a second groove 503 concaved downwardly from the second top surface 502, and the second magnetic layer 50C is formed on the second top surface 502 and fills up the second groove 503 (the second groove 503 is filled with the second magnetic layer 50C).

In conclusion, the instant disclosure can match the substance unit, the source line unit, the insulation unit, the transistor unit, the MTJ unit, and the bit line unit with each other to design the spin transfer torque random access memory.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A spin transfer torque random access memory, comprising:
   a substance layer;
   a plurality of source lines formed inside the substance layer and separated from each other;

a plurality of insulation layers formed inside the substance layer, wherein each insulation layer is connected between the two adjacent source lines;

a plurality of transistors respectively disposed on the source lines, wherein each transistor includes a source region formed on and right above the corresponding source line, a channel region formed on the source region, a drain region formed on the channel region, a surrounding gate oxide layer formed around the source region, the channel region and the drain region for contacting and enclosing the source region, the channel region and the drain region, and a surrounding gate region formed around the surrounding gate oxide layer for contacting and enclosing the surrounding gate oxide layer;

a plurality of magnetic tunnel junction (MTJ) structures respectively disposed on the transistors, wherein each MTJ structure includes a first magnetic layer formed on the drain region of the corresponding transistor, a tunneling barrier layer formed on the first magnetic layer, and a second magnetic layer formed on the tunneling barrier layer; and a bit line disposed on the MTJ structures to contact the second magnetic layers of the MTJ structures;

wherein the first magnetic layer has a centrally disposed recess extending downwardly to a bottom inner surface of the first magnetic layer and a top portion extending from an outer perimeter surface thereof to an inner wall surface circumscribing the recess, and the tunneling barrier layer extends into the recess of the first magnetic layer and has a centrally disposed recess extending downwardly therein to a bottom inner surface overlaying the bottom inner surface of the first magnetic layer, the tunneling barrier layer further has a top portion overlaying the top portion of the first magnetic layer and extends from an outer perimeter surface thereof to a tunneling barrier layer inner wall surface circumscribing the recess of the tunneling barrier layer the outer perimeter surface of the tunneling barrier layer being in substantially aligned relationship with the outer perimeter surface of the first magnetic layer;

wherein the second magnetic layer fills the recess of the tunneling barrier layer and has a shoulder portion overlaying the top portion of the tunneling barrier layer, the shoulder portion of the second magnetic layer has an outer perimeter surface disposed in substantially aligned relationship with the outer perimeter surface of the tunneling barrier layer.

* * * * *